United States Patent
Anderson et al.

(10) Patent No.: US 8,569,131 B2
(45) Date of Patent: Oct. 29, 2013

(54) SOURCE/DRAIN-TO-SOURCE/DRAIN RECESSED STRAP AND METHODS OF MANUFACTURE OF SAME

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 12/949,888

(22) Filed: Nov. 19, 2010

(65) Prior Publication Data

US 2012/0126337 A1 May 24, 2012

(51) Int. Cl.
 *H01L 21/336* (2006.01)
(52) U.S. Cl.
 USPC ........... 438/267; 257/330; 438/259; 438/270; 438/271
(58) Field of Classification Search
 USPC .................................................. 438/957, 267
 See application file for complete search history.

(56) References Cited

U.S. PATENT DOCUMENTS

| | | |
|---|---|---|
| 5,666,002 A | 9/1997 | Yamamoto et al. |
| 6,215,158 B1 | 4/2001 | Choi |
| 6,268,248 B1 | 7/2001 | Mehrad |
| 6,503,787 B1 | 1/2003 | Choi |
| 6,620,698 B1 | 9/2003 | Chen et al. |
| 6,653,183 B2 | 11/2003 | Hung et al. |
| 6,716,744 B2 | 4/2004 | Pan et al. |
| 6,780,737 B2 | 8/2004 | Chen |
| 7,439,578 B2 | 10/2008 | Takeda et al. |
| 2002/0090824 A1* | 7/2002 | Jaiprakash et al. ........... 438/700 |

* cited by examiner

*Primary Examiner* — Ajay K Arora
(74) *Attorney, Agent, or Firm* — Schmeiser, Olsen & Watts; Michael LeStrange

(57) ABSTRACT

A structure and a method of making the structure. The structure includes first and second semiconductor regions in a semiconductor substrate and separated by a region of trench isolation in the semiconductor substrate; a first gate electrode extending over the first semiconductor region; a second gate electrode extending over the second semiconductor region; a trench contained in the region of trench isolation and between and abutting the first and second semiconductor regions; and an electrically conductive strap in the trench, the strap electrically connecting the first and second semiconductor regions.

20 Claims, 15 Drawing Sheets

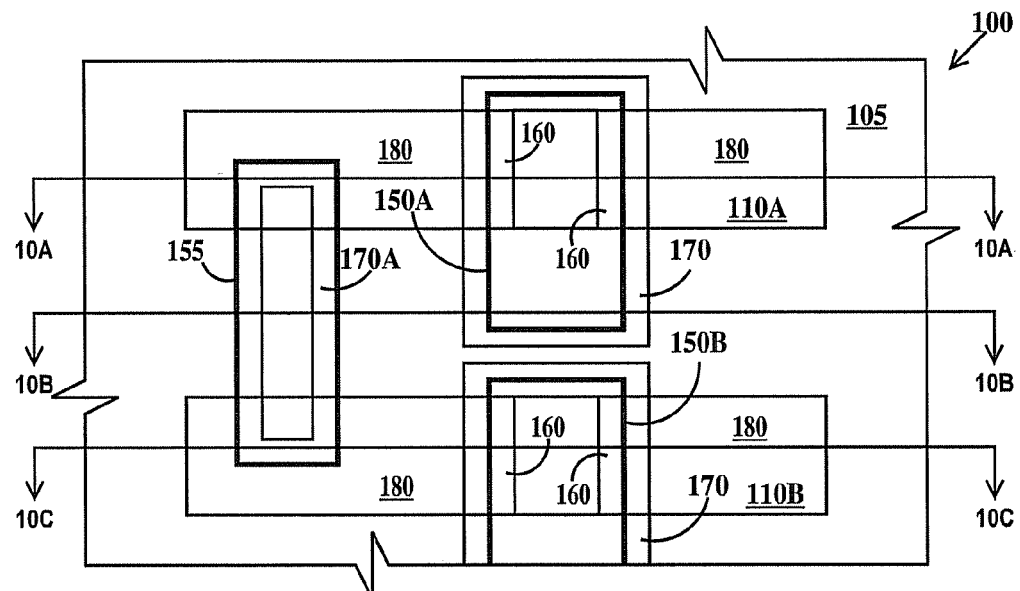
*FIG. 10*
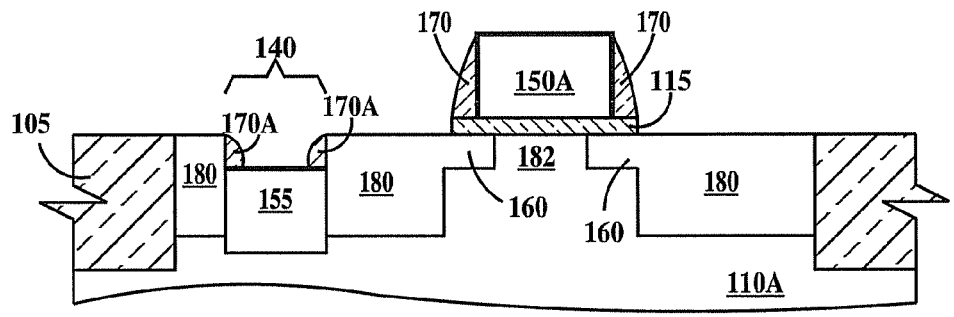
*FIG. 10A*
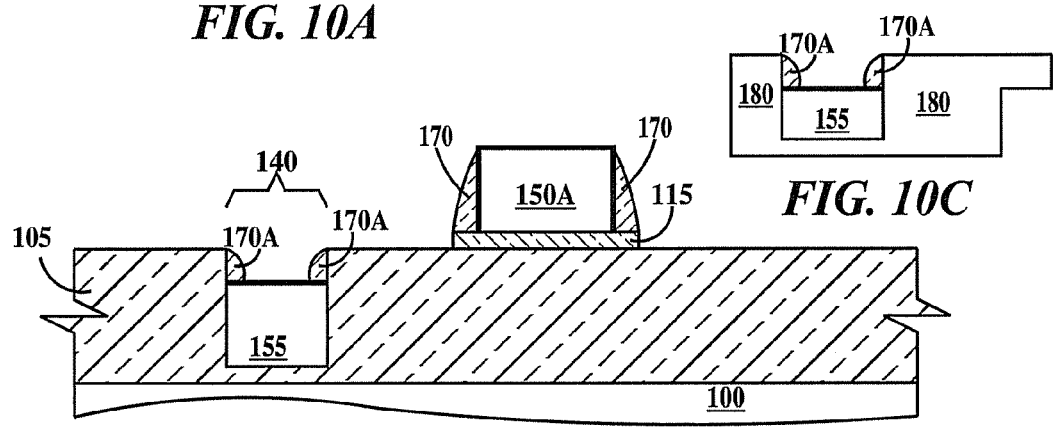
*FIG. 10C*
*FIG. 10B*

US 8,569,131 B2

SOURCE/DRAIN-TO-SOURCE/DRAIN RECESSED STRAP AND METHODS OF MANUFACTURE OF SAME

FIELD OF THE INVENTION

The present invention relates to the field of semiconductor devices; more specifically, it relates to MOSFET source/drain-to-source/drain interconnections and methods of fabricating MOSFET source/drain-to-source/drain interconnections.

BACKGROUND

As the dimensions of integrated circuits decrease, lithographic constraints are tending toward the gates of field effect transistors (FETs) to be orientated in a single direction on a fixed pitch. This adds to an increase in the density of the wiring at the next level used to interconnect source/drains of two or more FETs which are also constrained by lithography. Accordingly, there exists a need in the art to mitigate the deficiencies and limitations described hereinabove.

SUMMARY

A first aspect of the present invention is a structure, comprising: first and second semiconductor regions in a semiconductor substrate and separated by a region of trench isolation in the semiconductor substrate; a first gate electrode extending over the first semiconductor region; a second gate electrode extending over the second semiconductor region; a trench contained in the region of trench isolation and between and abutting the first and second semiconductor regions; and an electrically conductive strap in the trench, the strap electrically connecting the first and second semiconductor regions.

A second aspect of the present invention is a method, comprising: forming trench isolation in a semiconductor substrate, the trench isolation separating first and second semiconductor regions in the semiconductor substrate; forming a trench in a region of the trench isolation and between and abutting the first and second semiconductor regions; and simultaneously forming a first gate electrode extending over the first semiconductor region, a second gate electrode extending over the second semiconductor region, and an electrically conductive strap in the trench, the strap electrically connecting the first and second semiconductor regions.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1 through 11 illustrate a first method of fabricating a gate-to-gate strap according to an embodiment of the present invention;

DETAILED DESCRIPTION

Figure 1:
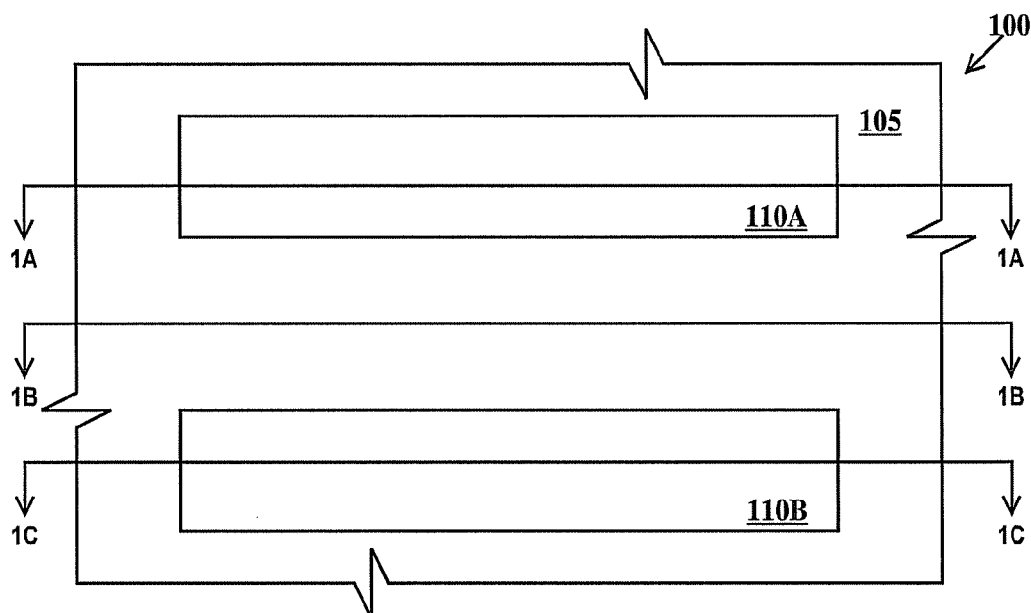
Figure 1A:
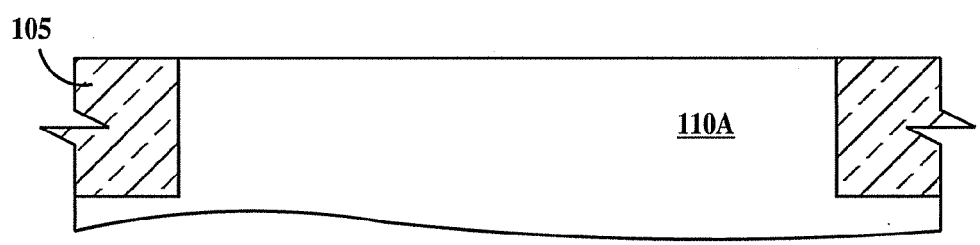
Figure 1B:
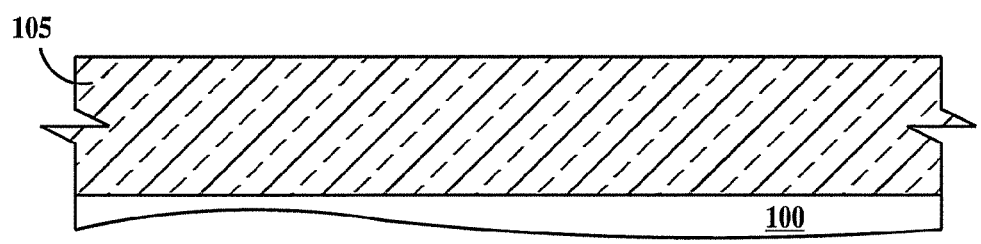

FIGS. 1 through 11 illustrate a first method of fabricating a gate-to-gate strap according to an embodiment of the present invention. FIG. 1 is a plan view and FIGS. 1A and 1B are cross-sectional views through lines 1A-1A and 1B-1B respectively of FIG. 1. A section though line 1C-1C would be similar to section 1A-1A. In FIGS. 1, 1A and 1B, formed in a semiconductor substrate 100 (or a semiconductor layer of semiconductor-on-insulator (SOI) substrate) is trench isolation 105 surrounding the perimeters of substrate regions 110A and 110B. In one example, semiconductor substrate is a single-crystal silicon substrate (or semiconductor layer is a single-crystal silicon layer of an SOI substrate). Trench isolation may be formed by etching a trench into the substrate, depositing a dielectric material (e.g., silicon dioxide ($SiO_2$)) to overfill the trench and cover the surface of substrate, followed by a chemical-mechanical-polish (CMP) to coplanarize the top surfaces of the substrate and the dielectric material in the trench.

Figure 2:
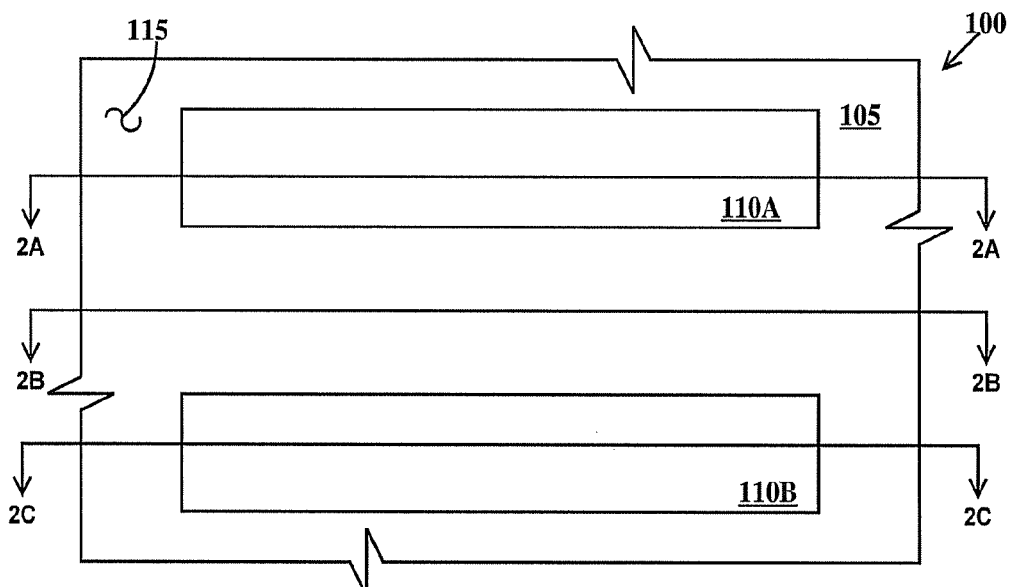
Figure 2A:
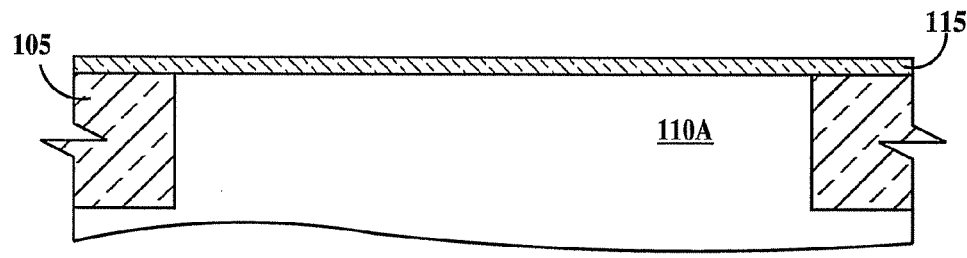
Figure 2B:
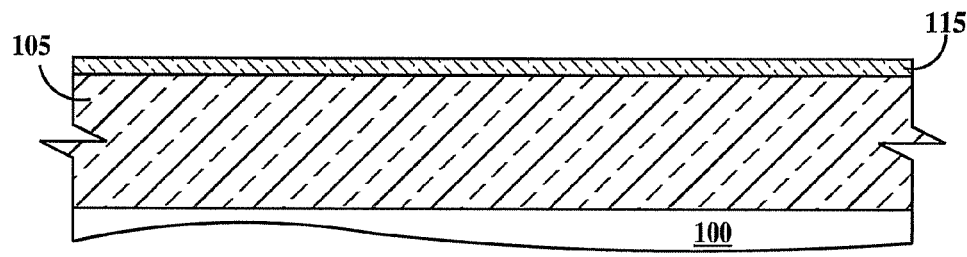

FIG. 2 is a plan view and FIGS. 2A and 2B are cross-sectional views through lines 2A-2A and 2B-2B respectively of FIG. 2. A section though line 2C-2C would be similar to section 2A-2A. In FIGS. 2, 2A and 2B a gate dielectric layer 115 is formed on trench isolation 105 and substrate regions 110A and 110B. In one example, gate dielectric layer 115 comprises $SiO_2$, silicon nitride ($Si_3N_4$) or combinations of layers thereof. In one example gate dielectric layer 115 is a high-K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high-K dielectric material has a relative permittivity above about 10. In one example, gate dielectric layer 115 is about 0.5 nm to about 20 nm thick.

Figure 3:
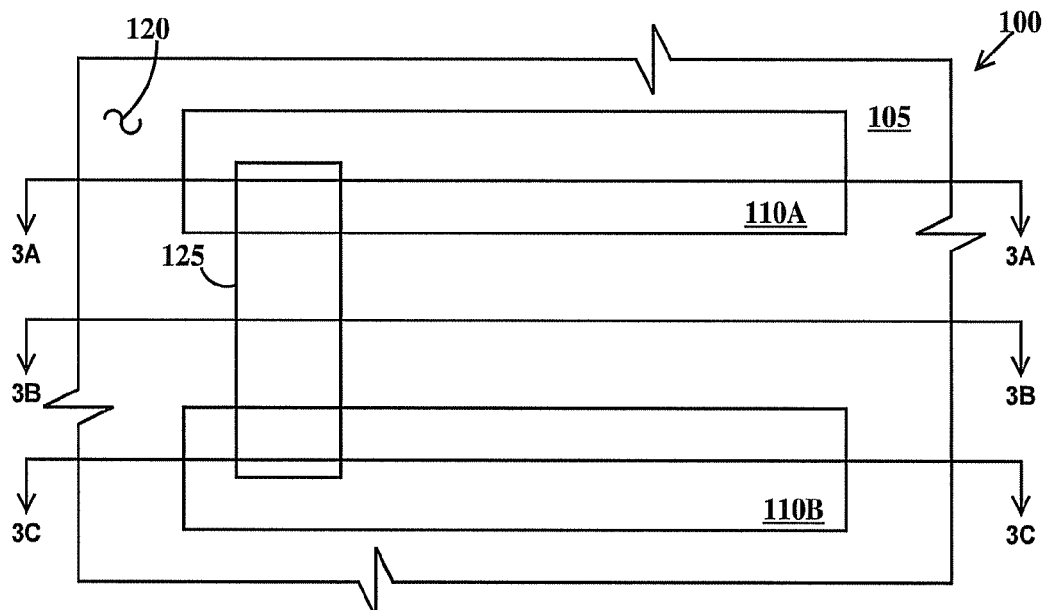
Figure 3A:
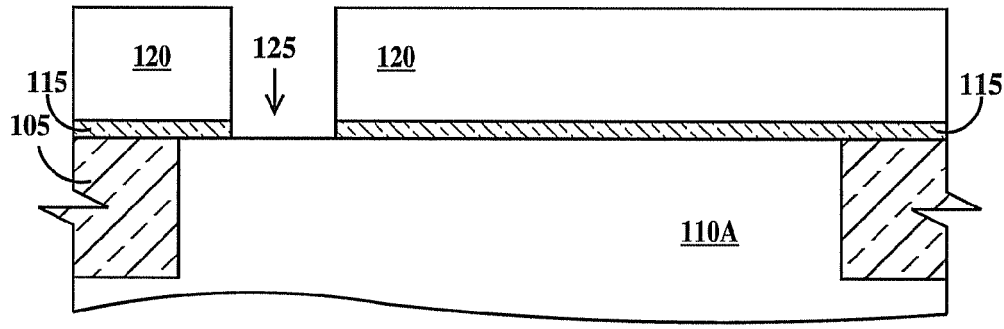
Figure 3B:
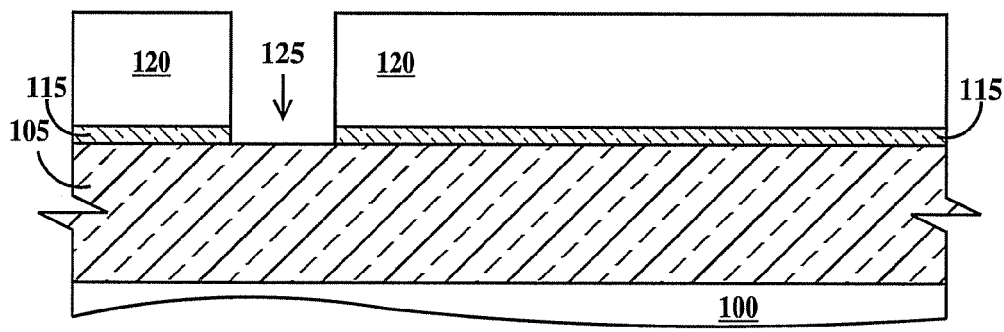

FIG. 3 is a plan view and FIGS. 3A and 3B are cross-sectional views through lines 3A-3A and 3B-3B respectively of FIG. 3. A section though line 3C-3C would be similar to section 3A-3A. In FIGS. 3, 3A and 3B a patterned photoresist layer 120 is formed and a trench 125 is etched (e.g., by reactive ion etch (RIE) in gate dielectric layer 115. Trench 125 extends over substrate regions 110A and 110B as well as a region of trench isolation 105 between substrate regions 110A and 110B.

Figure 4:
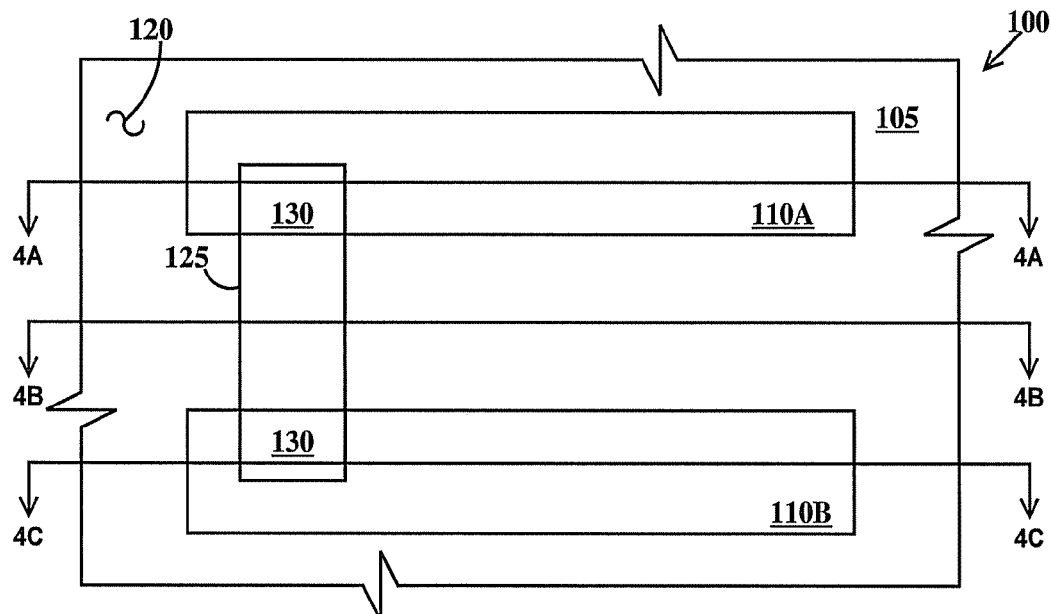
Figure 4A:
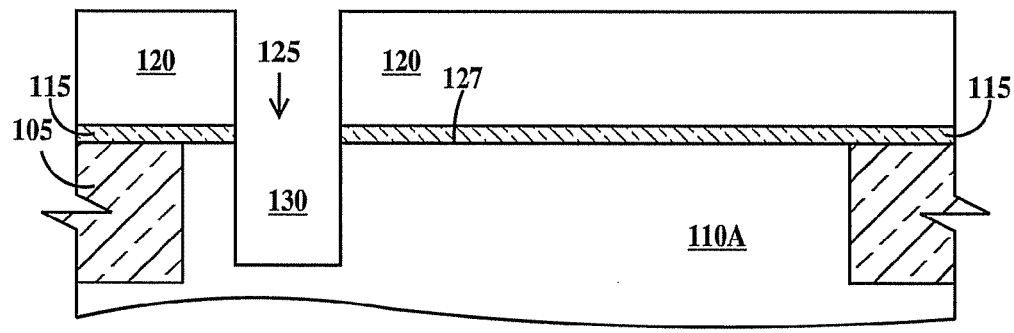
Figure 4B:
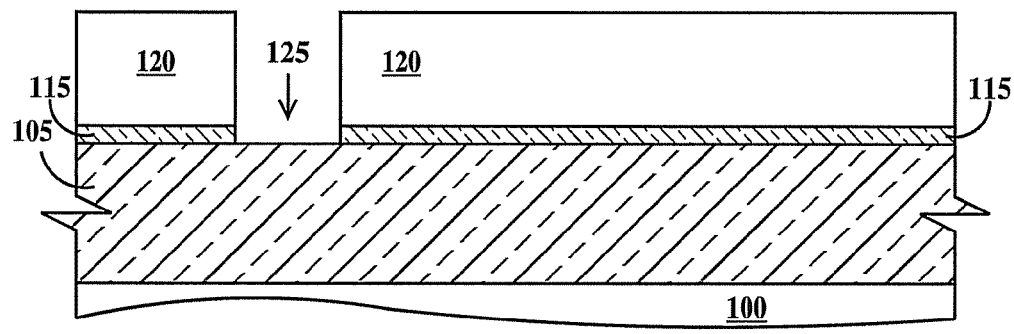

FIG. 4 is a plan view and FIGS. 4A and 4B are cross-sectional views through lines 4A-4A and 4B-4B respectively of FIG. 4. A section though line 4C-4C would be similar to section 4A-4A. In FIGS. 4, 4A and 4B trenches 130 are etched in substrate regions 110A and 110B where substrate regions 110A and 110B are exposed in trench 125. In one example, trenches 130 are etched using a RIE etch selective to substrate 100 (e.g., silicon) over trench isolation (e.g., silicon oxide). Trenches 130 extend from a top surface 127 of substrate into substrate 100. Though illustrated as still present, patterned photoresist layer 120 may be removed prior to etching trenches 130.

Figure 5:
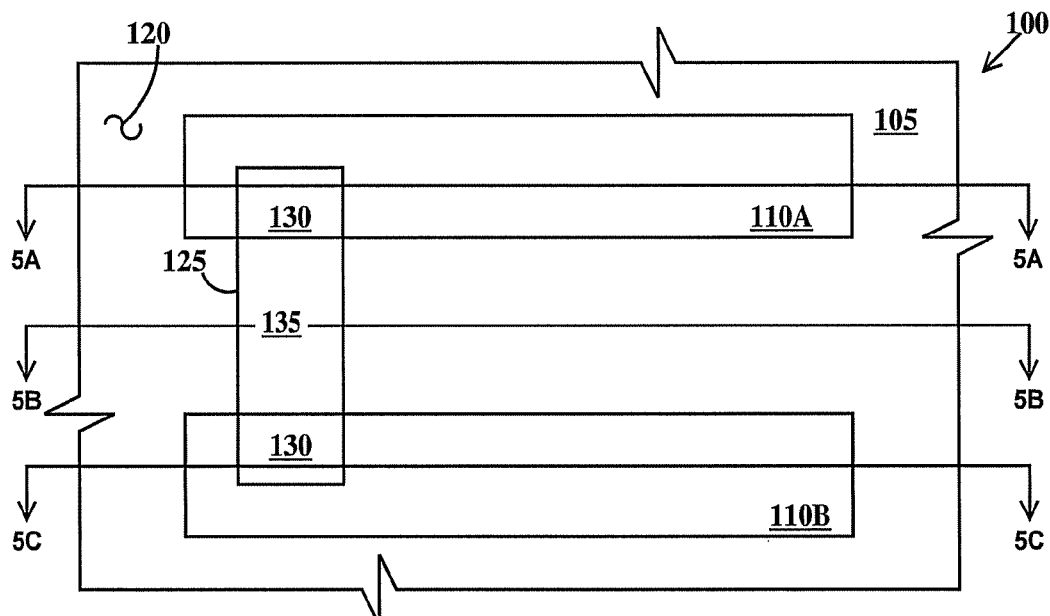
Figure 5A:
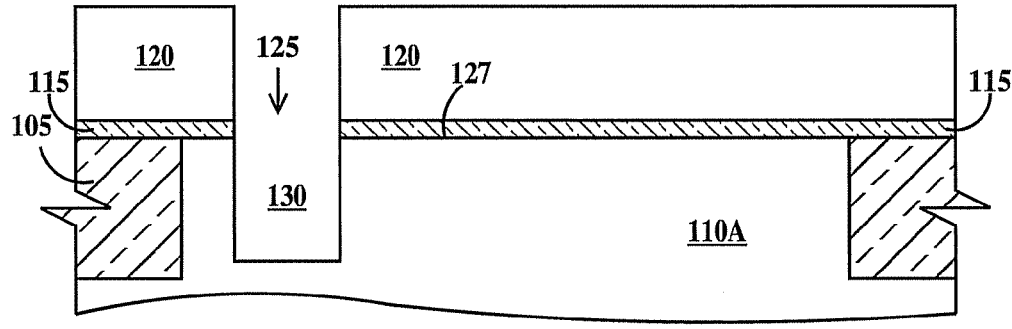
Figure 5B:
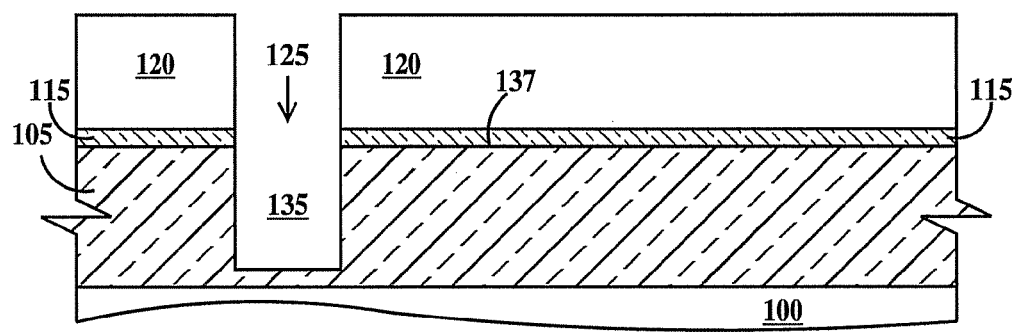

FIG. 5 is a plan view and FIGS. 5A and 5B are cross-sectional views through lines 5A-5A and 5B-5B respectively of FIG. 5. A section though line 5C-5C would be similar to section 5A-5A. In FIGS. 5, 5A and 5B a trench 135 is etched in trench isolation 115 where trench isolation 105 is exposed in trench 125. In one example, trench 135 is etched using a RIE etch selective to trench isolation 105 (e.g., silicon oxide) over substrate 100 (e.g., silicon). Though illustrated as still present, patterned photoresist layer 120 may be removed prior to etching trench 135 if not already removed previously. Trench 135 extends from a top surface 137 of trench isolation 105 into trench isolation 105. Trench 135 does not extend through trench isolation 105 to underlying substrate 100.

Figure 6:
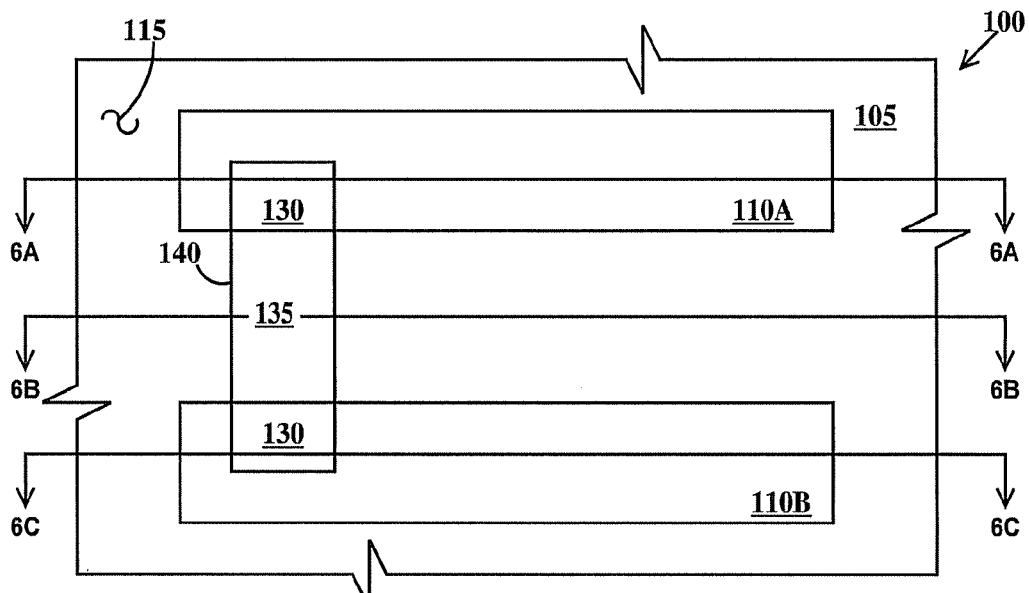
Figure 6A:
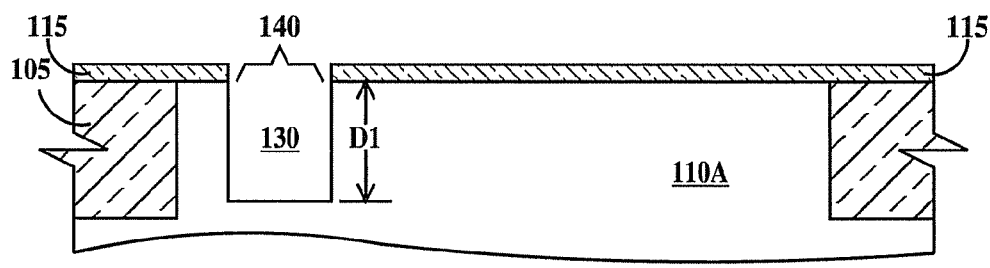
Figure 6B:
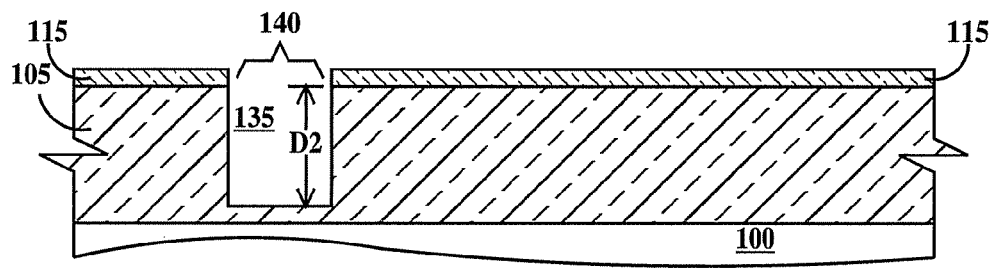

FIG. 6 is a plan view and FIGS. 6A and 6B are cross-sectional views through lines 6A-6A and 6B-6B respectively of FIG. 6. A section though line 6C-6C would be similar to section 6A-6B. In FIGS. 6, 6A and 6B patterned photoresist layer 120 (see, for example FIGS. 3, 3A and 3B) is removed if not removed previously. A completed trench 140 includes trenches 130 and trench 135. Trench 135 is open within trench 140 to trenches 130. The depth of trench 130 is D1 and the depth of trench 135 is D2. In one example, D1 is equal to D2. In one example, D1 is greater than D2. In one example, D2 is greater than D2.

Figure 7:
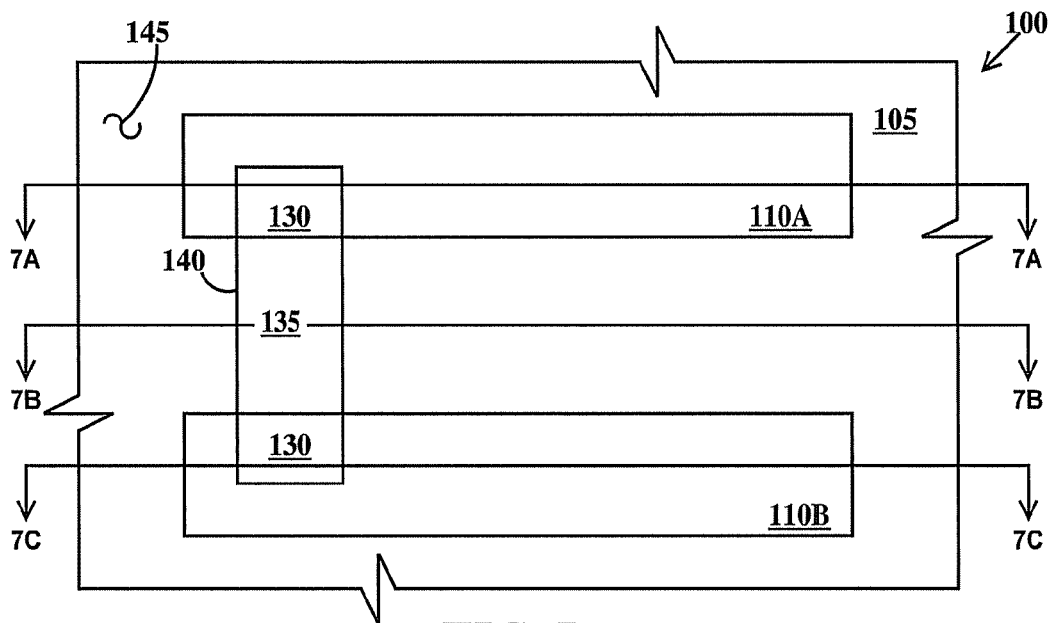
Figure 7A:
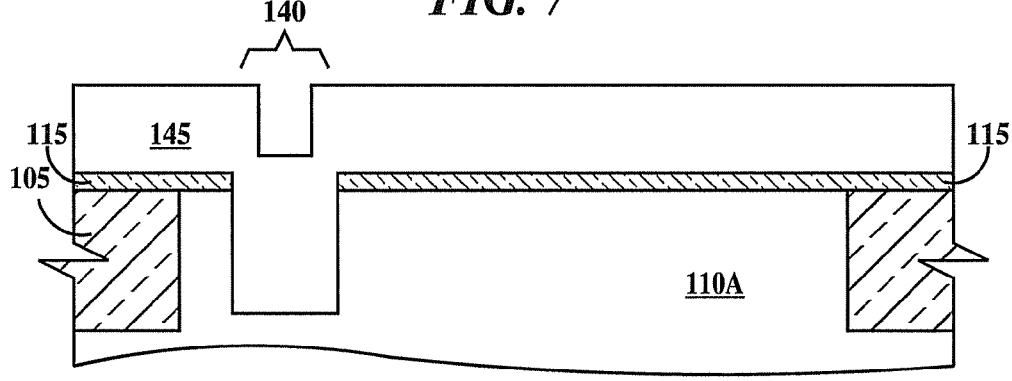
Figure 7B:
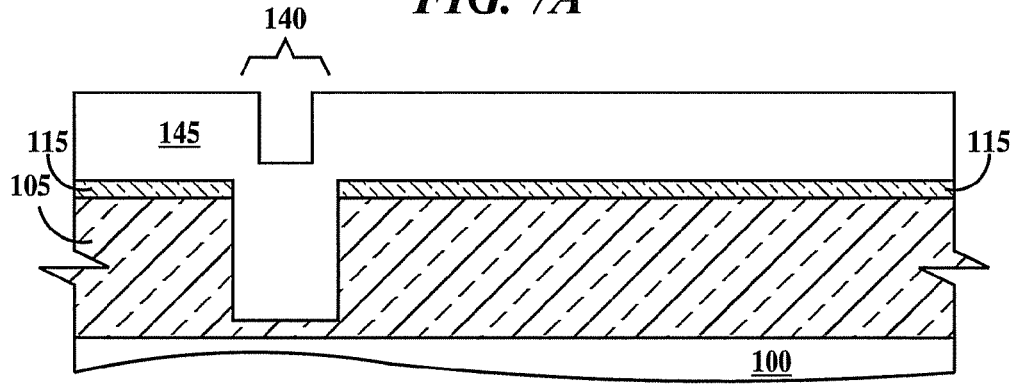

FIG. 7 is a plan view and FIGS. 7A and 7B are cross-sectional views through lines 7A-7A and 7B-7B respectively of FIG. 7. A section though line 7C-7C would be similar to section 7A-7A. In FIGS. 7, 7A and 7B an electrically conductive layer 145 is deposited on substrate 100 and in trench 140. In one example, electrically conductive layer 145 is polysilicon formed by chemical vapor deposition (CVD).

Figure 8:
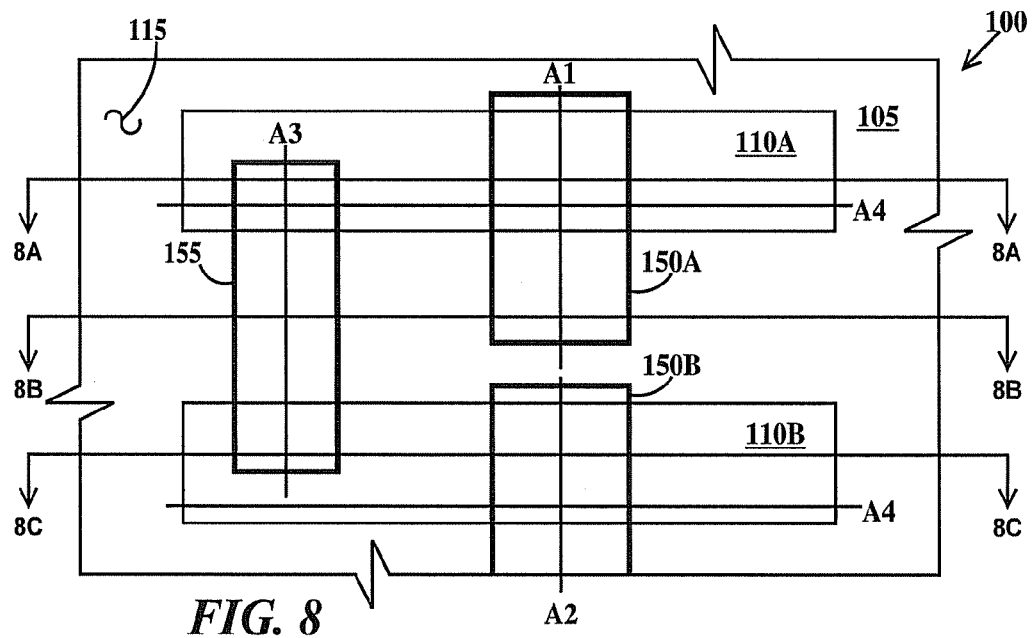
Figure 8A:
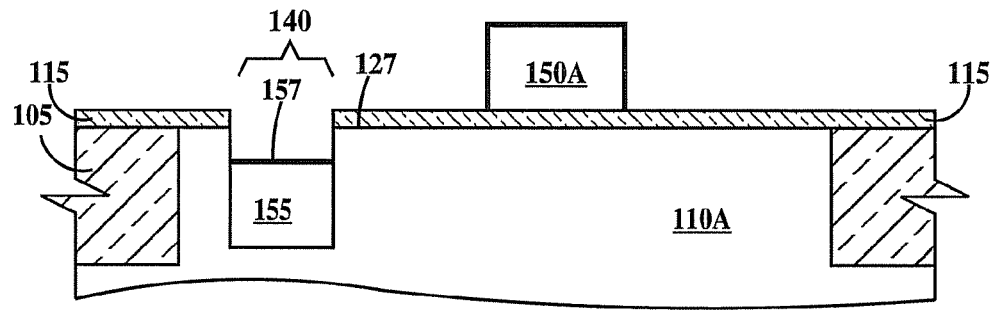
Figure 8B:
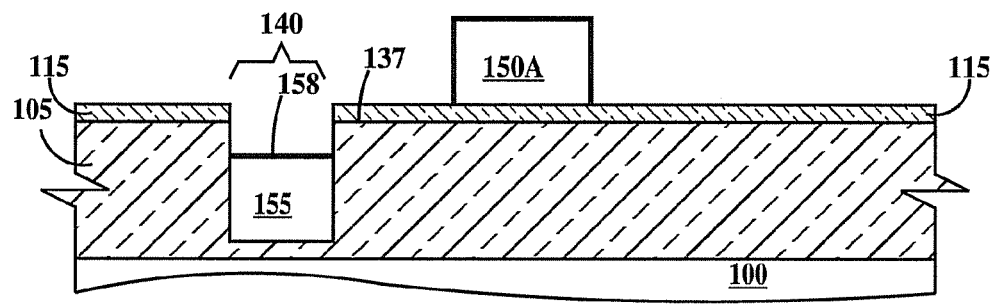

FIG. 8 is a plan view and FIGS. 8A and 8B are cross-sectional views through lines 8A-8A and 8B-8B respectively of FIG. 8. A section though line 8C-8C would be similar to section 8A-8A. In FIGS. 8, 8A and 8B, a gate electrode 150 and a strap 155 are formed. Gate electrodes 150A and 150B and strap 155 are simultaneously formed. In one example gate electrodes 150A and 150B and strap 155 are formed by a photolithographic process that forms a patterned photoresist layer on polysilicon layer 145 (see FIGS. 7, 7A and 7B) only over the region of the polysilicon layer that is to become the gate electrodes, followed by an RIE, followed by removal of the patterned photoresist layer. Strap 155 is recessed into trench 140. In a preferred embodiment, a top surface 157 of strap 155 is recessed below top surface 127 of substrate 100 and a top surface 158 of strap 155 is recessed below top surface 137 of trench isolation 105. Alternatively, at least regions of top surfaces 157 and 158 may be may extend above top surfaces 127 and 137 respectively.

In FIG. 8, first major axes A1 of gate electrode 150A, A2 of second gate electrode 150B and A3 of strap 155 are parallel. Second major axes A4 of first semiconductor region 110A and A5 of second semiconductor region 110B are parallel. Major axes A1, A2 and A3 are perpendicular to major axes A4 and A5. Strap 155 does not extend vertically through trench isolation 105 into substrate 100.

Figure 9:
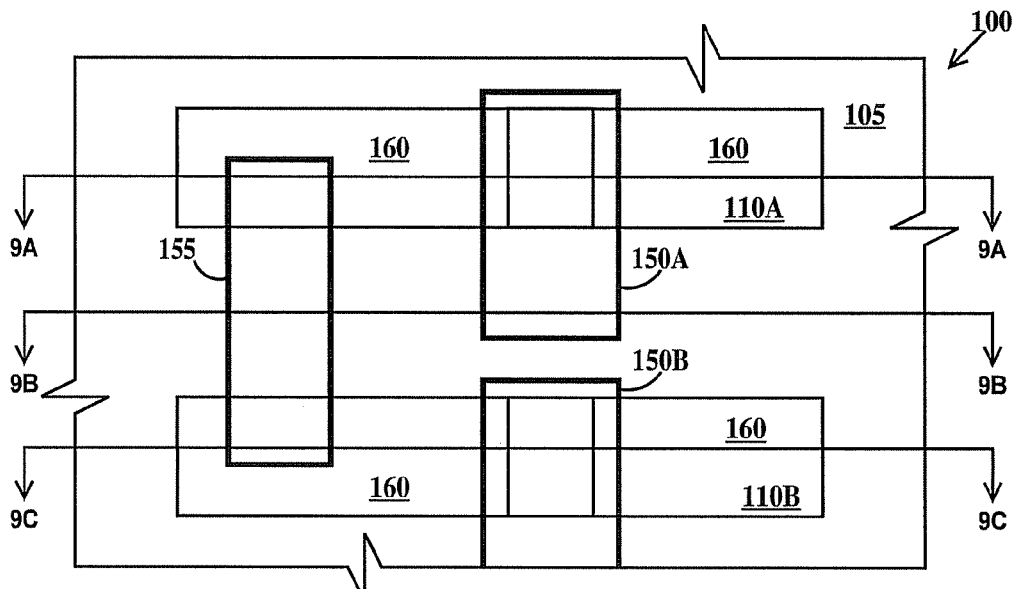
Figure 9A:
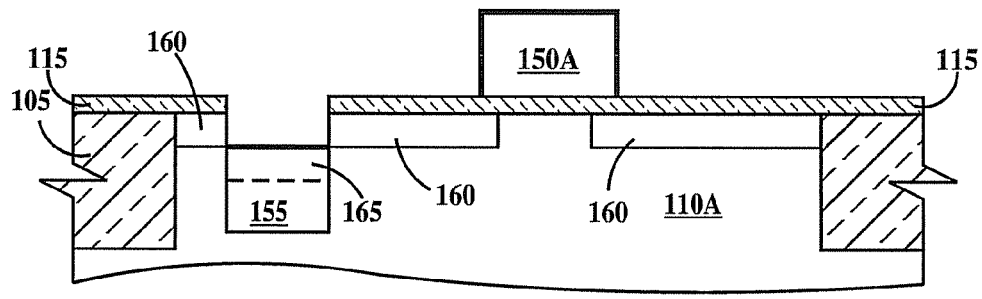
Figure 9B:
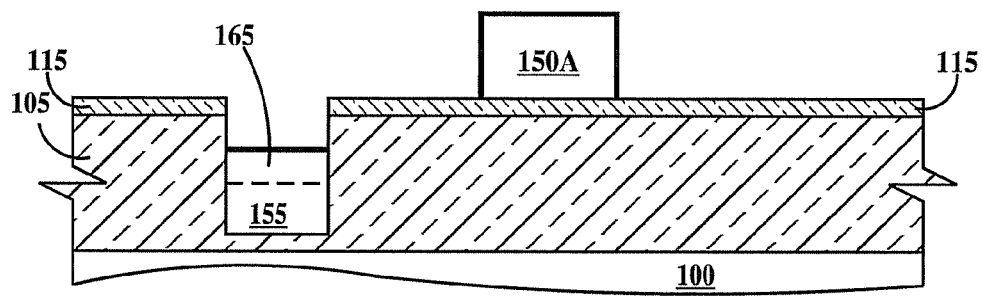

FIG. 9 is a plan view and FIGS. 9A and 9B are cross-sectional views through lines 9A-9A and 9B-9B respectively of FIG. 9. A section though line 9C-9C would be similar to section 9A-9A. In FIGS. 9 and 9B source/drain extensions 160 are formed in substrate regions 110A and 110B. Source/drain extensions may be formed by an angled (at an acute angle relative to the top surface of substrate 100) ion implantation while substrate 100 is rotating about an axis perpendicular to the top surface of the substrate. The source/drain ion implantation also implants dopant into an upper region 165 of strap 155.

FIG. 10 is a plan view and FIGS. 10A and 10B are cross-sectional views through lines 10A-10A and 10B-10B respectively of FIG. 10. A section though line 10C-10C would be similar to section 10A-10A. In FIGS. 10, 10A and 10B dielectric sidewall spacers 170 are formed on the sidewalls of gate electrodes 150A and 150B and sidewall spacers 170A are formed on the sidewalls of trench 140. In one example, sidewall spacers 170 and 170A comprise $Si_3N_4$. Sidewall spacers 170 and 170A may be formed simultaneously by a blanket deposition of a conformal dielectric layer followed by an RIE to remove the dielectric material from horizontal surfaces (surfaces parallel to the top surface of substrate 100).

After sidewall spacer formation, source/drains 180 are formed in substrate regions 110A and 110B, for example, by ion implantation where substrate regions 110A and 110B are not protected by gate electrodes 150A and 150B or sidewall spacers 170. Source/drains 180 include integral source/drain extensions 160. Channel regions 182 of substrate region 110A (and 110B) are defined between source/drain extensions 160 under gate electrode 150A (and 150B, not shown). In one example, gate dielectric layer 115 is also removed by the spacer RIE process where the gate dielectric layer is not protected by gate electrodes 150A and 150B or sidewall spacers 170 (as they are formed). The source/drain ion implantation also implants dopant into an upper region of strap 155.

Although, strap 155 is illustrated in FIG. 10A as extending vertically all the way through source/drains 180, into substrate region 110A, alternatively, strap 155 may not extend vertically through source/drains 180 into substrate region 110A.

Figure 11:
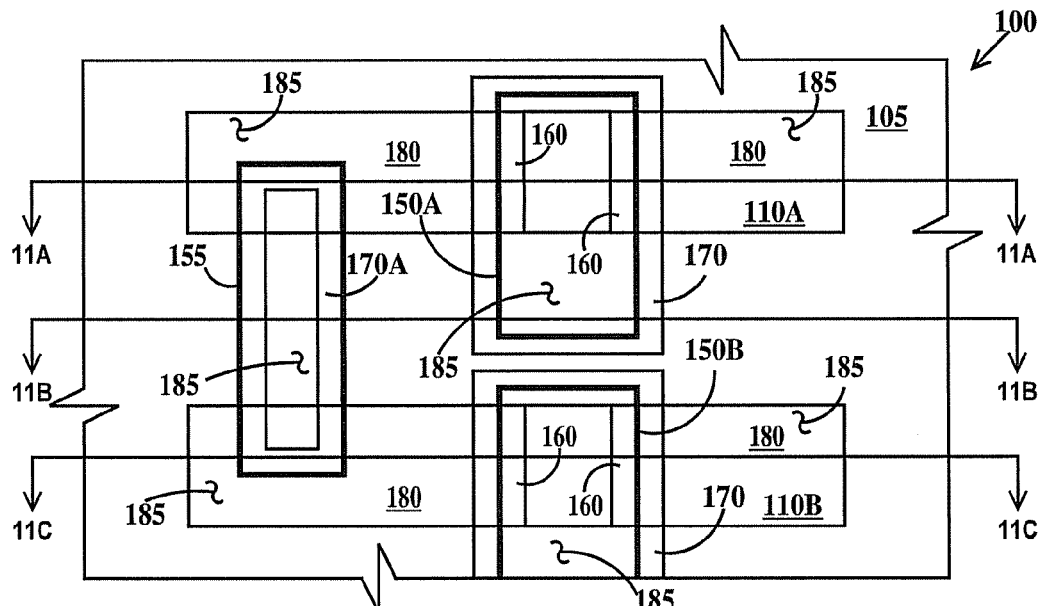
Figure 11A:
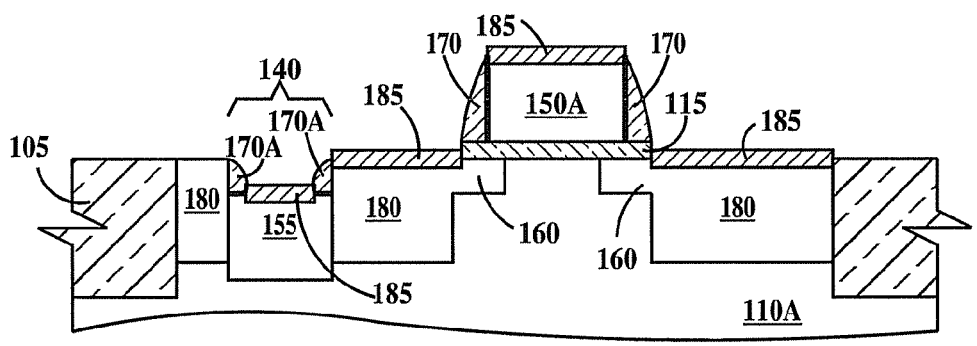
Figure 11B:
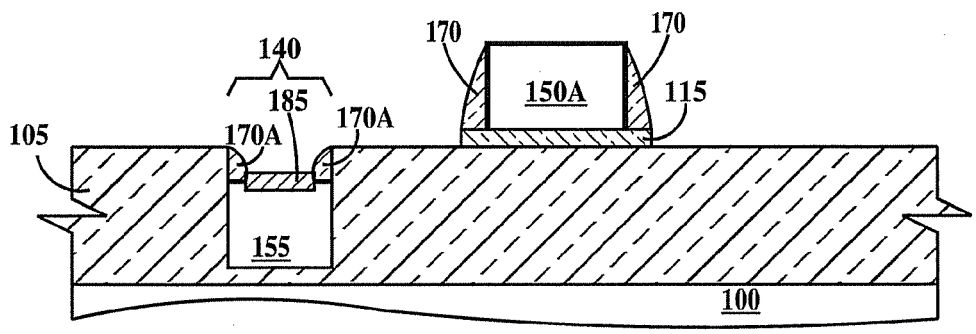

FIG. 11 is a plan view and FIGS. 11A and 11B are cross-sectional views through lines 11A-11A and 11B-11B respectively of FIG. 11. A section though line 11C-11C would be similar to section 11A-11A. In FIGS. 11A and 11B optional metal silicide layers 185 (when semiconductor regions 110A and 110B include or are silicon) are formed on exposed surfaces of source/drains 180, gate electrodes 150A and 150B and strap 155. Metal silicide layers 185 may be formed by depositing a thin metal layer, followed by high temperature heating in an inert or reducing atmosphere at a temperature that will cause the metal to react with silicon followed by an etch to remove un-reacted metal. Because of sidewall spacers 170A silicide layer 185 does not cover the entire top surface of strap 155, but is continuous from source/drain 180 in substrate region 110A to source/drain 180 in substrate region 110B.

Figure 12:
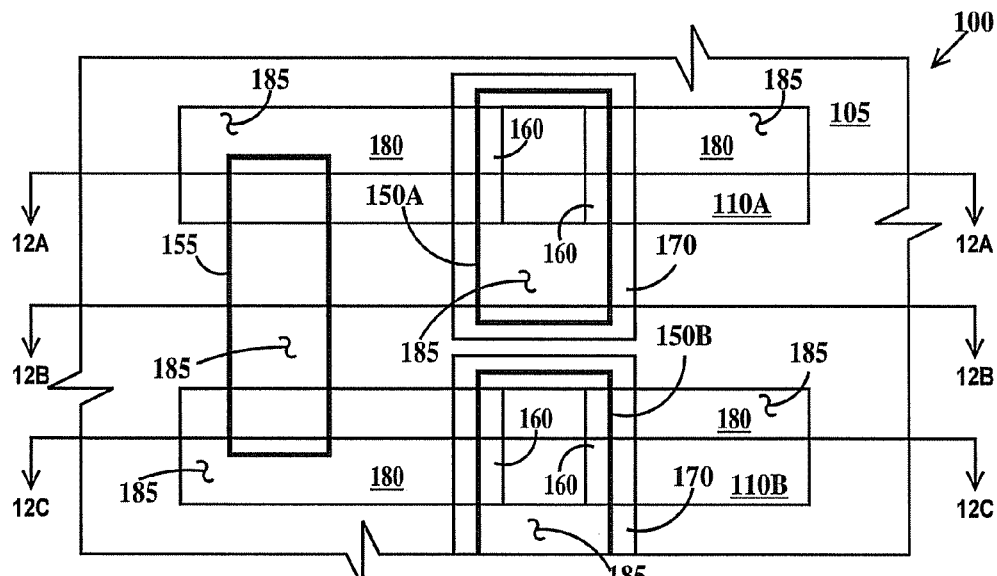
FIG. 12 illustrates the result of adding an additional process step after the step illustrated in FIG. 9.
Figure 12A:
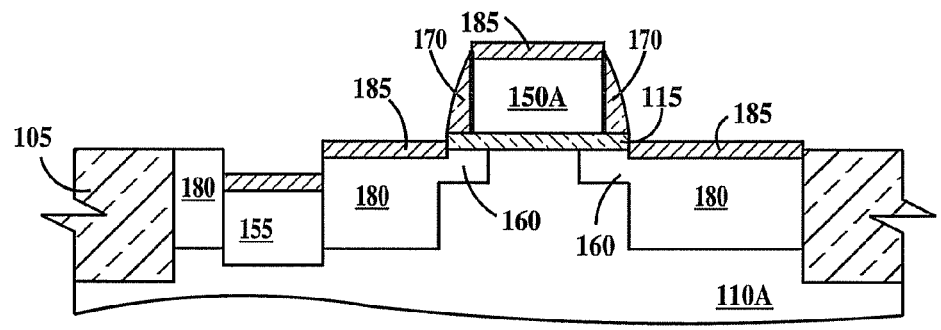
Figure 12B:
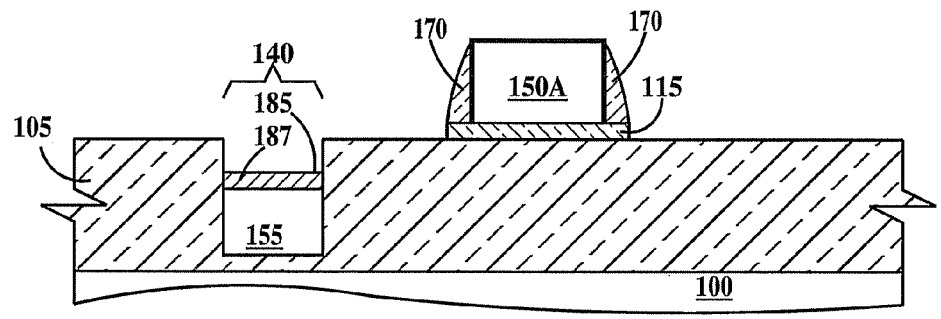

FIG. 12 illustrates the result of adding an additional process step after the step illustrated in FIG. 9. FIG. 12 is a plan view and FIGS. 12A and 12B are cross-sectional views through lines 12A-12A and 12B-12B respectively of FIG. 12. A section though line 12C-12C would be similar to section 12A-12A. In FIGS. 12A and 12B sidewall spacers 170A are removed prior to silicide formation (either before or after source/drain formation) so silicide layer 185 covers all of a top surface 187 of strap 155.

Figure 13:
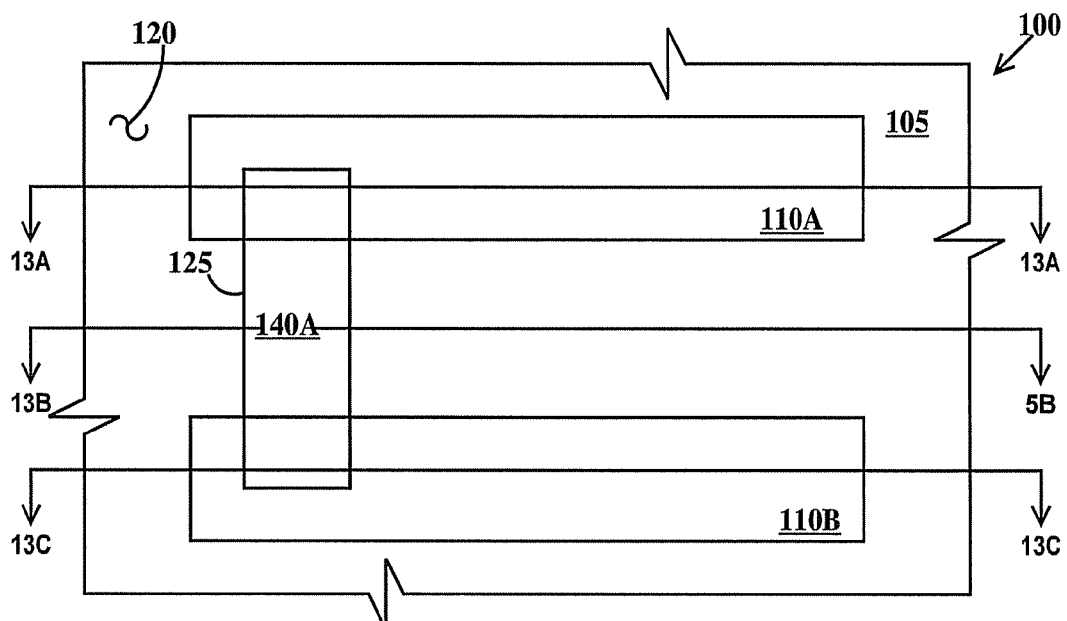
FIGS. 13-15 illustrate fabrication of and an alternative strap configuration according to an embodiment of the present invention.
Figure 13A:
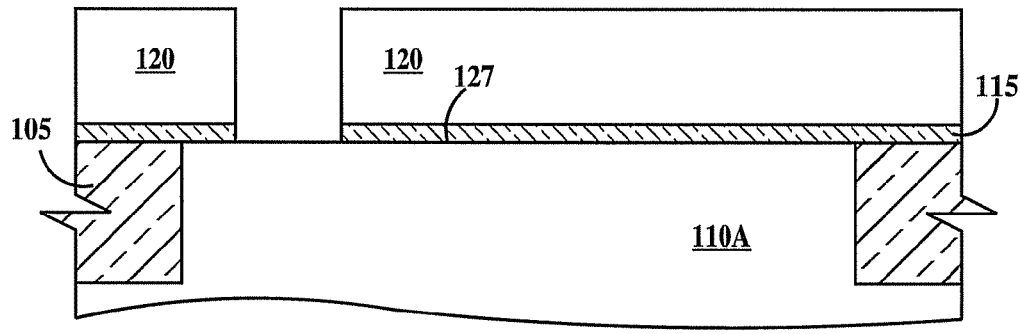
Figure 13B:
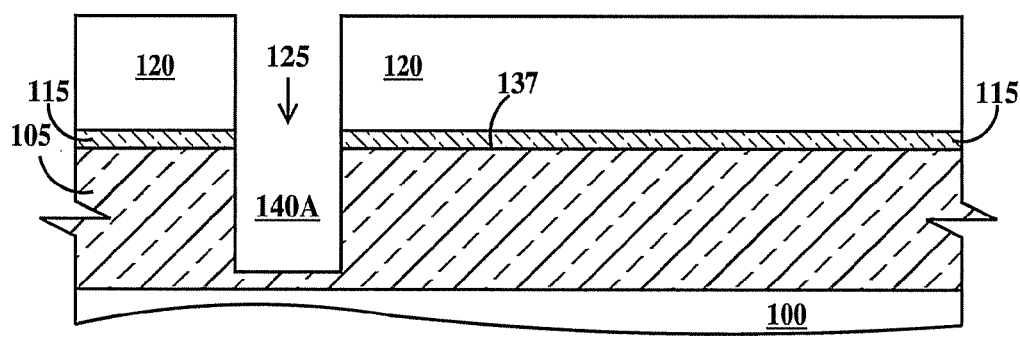
Figure 14:
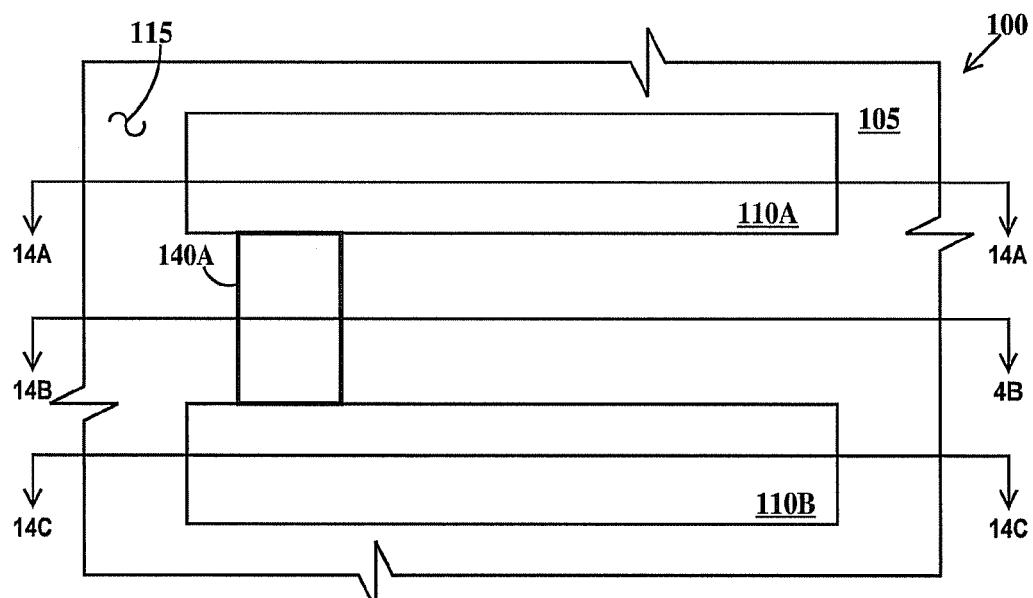
Figure 15:
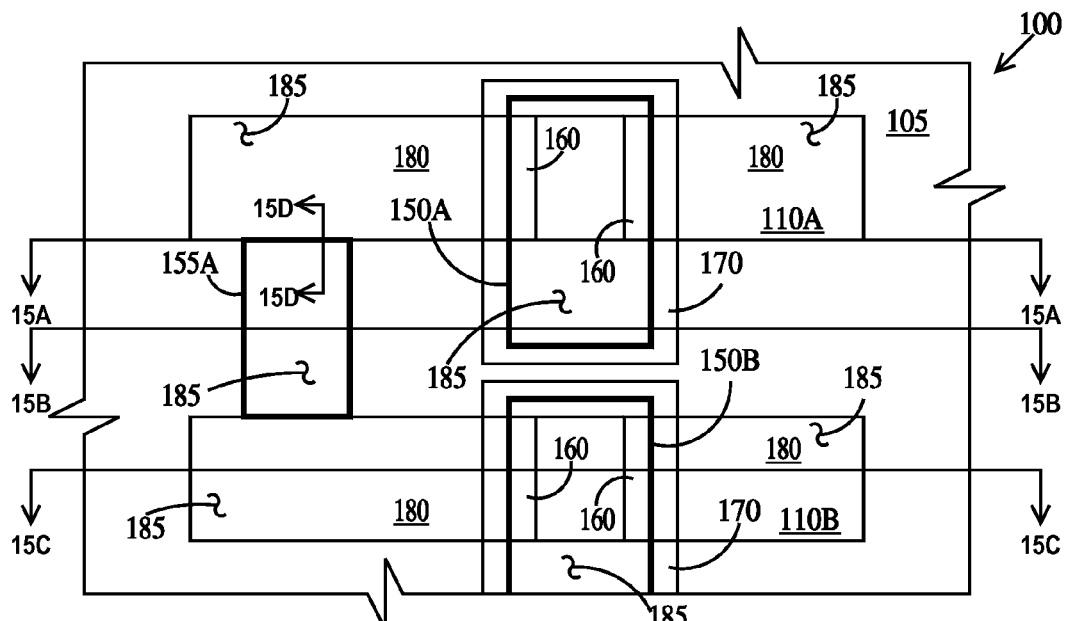

FIGS. 13-15 illustrate fabrication of and an alternative strap configuration according to an embodiment of the present invention. FIG. 13 is a plan view and FIGS. 13A and 13B are cross-sectional views through lines 13A-13A and 13B-13B respectively of FIG. 13. A section though line 13C-13C would be similar to section 13A-13A. FIGS. 13, 13A and 13B are similar to respective FIGS. 5A, 5B and 5C. The steps illustrated in FIGS. 1 and 2 are performed the steps in FIG. 13. In FIGS. 13A and 13B trench 135 is formed only in trench isolation 105. Gate dielectric layer 115 is removed from over substrate regions 110A and 110B where the dielectric layer is not covered by patterned photoresist layer 120 and an etch selective to trench isolation 105 over substrate regions 110A and 110B is performed so essentially no trench is formed in substrate regions 110A and 110B while a trench 140A is formed in trench isolation 105. Trench 125 does not extend into substrate regions 110A and 110B but abuts them.

Figure 14A:
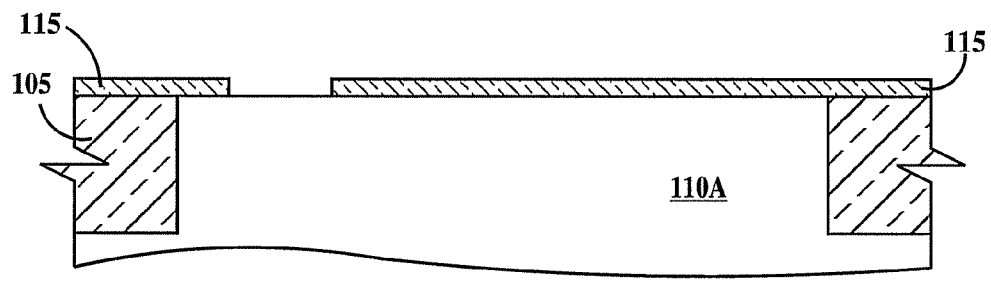
Figure 14B:
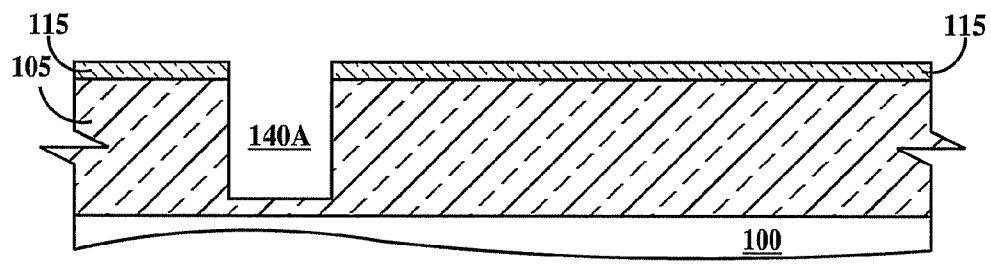

FIG. 14 is a plan view and FIGS. 14A and 14B are cross-sectional views through lines 14A-14A and 14B-14B respectively of FIG. 14. A section though line 14C-14C would be similar to section 14A-14A. In FIGS. 14A and 14B patterned photoresist layer 120 (see FIG. 13) is removed. Trench 140A does not extend vertically through trench isolation 105. Trench 140A extends from substrate region 110A to substrate region 110B.

Figure 15A:
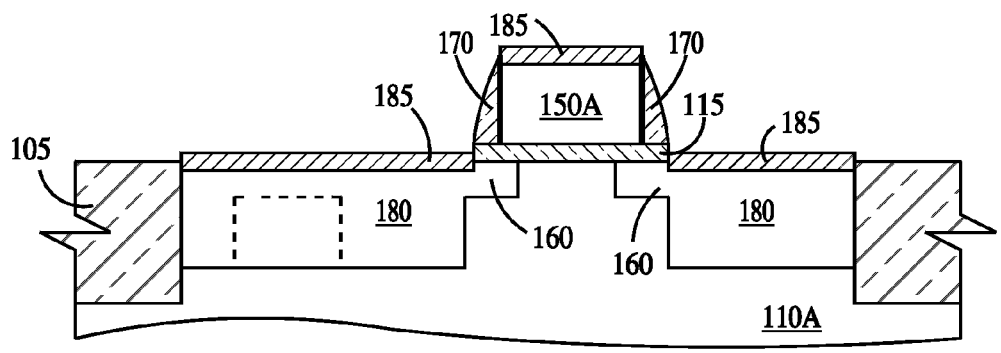
Figure 15B:
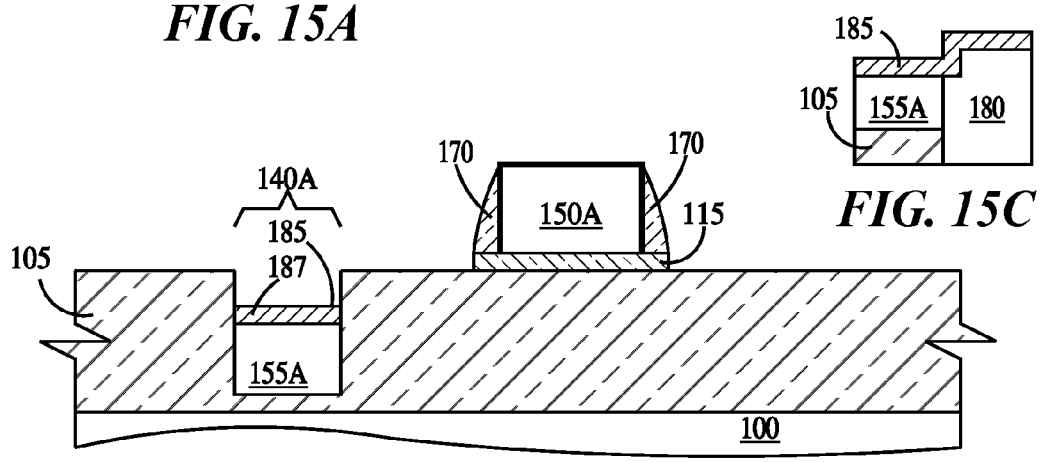
Figure 15C:
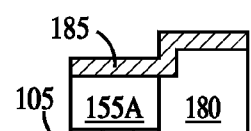

FIG. 15 is a plan view and FIGS. 15A, 15B and 15D are cross-sectional views through lines 15A-15A, 15B-15B and 15C-15C respectively of FIG. 15. A section though line 15C-15C would be similar to section 15A-15A. In FIGS. 15A and 15B the steps illustrated in FIGS. 7 through 10 and 12 are performed resulting in the structures of FIGS. 15, 55A, 15B, and 15C. Strap 155A abuts sidewalls of source/drains 180 as illustrated by the dashed lines of FIG. 15A. Silicide layer 185 forms a continuous layer over source drains 180 that abut strap 155A and over strap 155A as illustrated in FIG. 15C. Thus there is an electrical connection between the source/drains abutting strap 155A through strap 155A as well as through silicide layer 185.

Thus the embodiments of the present invention provide a recessed strap for interconnecting two or more source/drains of adjacent MOSFETs, reducing the need for interconnecting the source/drains at a higher interconnect level.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming trench isolation in a semiconductor substrate, said trench isolation separating first and second semiconductor regions in said semiconductor substrate;
    forming a trench in a region of said trench isolation and between and abutting said first and second semiconductor regions; and
    simultaneously forming a first gate electrode extending over said first semiconductor region, a second gate electrode extending over said second semiconductor region, and an electrically conductive strap in said trench, said strap physically abutting and electrically connecting said first and second semiconductor regions.

2. The method of claim 1, wherein said first and second gate electrodes and said strap are unconnected regions of a same layer of a same material.

3. The method of claim 1, wherein a top surface of said strap is recessed below a top surface of said trench isolation and respective top surfaces of said first and second semiconductor regions.

4. The method of claim 1, wherein said first and second gate electrodes and said strap comprise polysilicon.

5. The method of claim 1, further including:
    forming a metal silicide layer on top surfaces of said first and second gate electrodes and said strap.

6. The method of claim 1, further including:
    forming a first gate dielectric layer between said first gate electrode and said first semiconductor region and a second gate dielectric layer between said second gate electrode and said second semiconductor region; and
    forming first source/drains in said first region on opposite sides of first gate electrode and second source/drains in said second region on opposite sides of second gate electrode.

7. The method of claim 6, wherein said strap electrically connects a source/drain of said first source/drains to a source/drain of said second source/drains.

8. The method of claim 1, wherein:
    first major axes of said first and second gate electrodes and said strap are parallel in a first direction that is parallel to a top surface of said semiconductor substrate;
    second major axes of said first and second semiconductor regions are parallel in a second direction that is parallel to said top surface of said semiconductor substrate; and
    wherein said first and second directions are perpendicular.

9. The method of claim 1, further including:
    simultaneously forming a first trench in said first semiconductor region and a second trench in said second semiconductor region, said trench between and opening into said first and second trenches.

10. The method of claim 9, wherein a depth of said first and second trenches measured in a direction perpendicular to a top surface of said substrate are different from a depth of said third trench measured in said direction perpendicular to a top surface of said substrate.

11. The method of claim 1, wherein said trench isolation is dielectric isolation.

12. The method of claim 1, wherein said trench isolation is formed from a dielectric material, said dielectric material extending from said first semiconductor region to said second semiconductor region.

13. The method of claim 1, wherein said strap physically and electrically only contacts sidewalls of said first and second semiconductor regions.

14. The method of claim 1, including:
    simultaneously forming a first metal silicide layer on top surface said first gate electrode, a second metal silicide layer on top surface said second gate electrode, and on a top surface of said strap.

15. The method of claim 1, wherein said strap extends into said first semiconductor region and said second semiconductor region.

16. The method of claim 1, wherein said trench does not extend through said trench isolation in a direction perpendicular to a top surface of said semiconductor substrate.

17. The method of claim 1, wherein said trench is formed in said trench isolation and in a first region of said first semiconductor region and in second region of said first semiconductor region.

18. The method of claim 17, wherein said trench does not extend through said trench isolation in a direction perpendicular to a top surface of said semiconductor substrate.

19. The method of claim 1, including:
    after forming said first and second gate electrodes and said strap, ion implanting a dopant species into said strap and said first and second semiconductor regions where said semiconductor regions are not covered by said first and second gate electrodes.

20. The method of claim 1, including:
    (a) etching said trench into said trench isolation;
    after (a), (b) forming a polysilicon layer on top surfaces of said first and second semiconductor regions and said trench isolation, said polysilicon layer filling said trench;
    after (b), (c) removing selected regions of said polysilicon layer to form said first and second gate electrodes and said strap;
    after (c), (d) forming source/drains in said first and second semiconductor regions where said semiconductor regions are not protected by said first and second source/drains.

* * * * *